United States Patent
Lee et al.

(10) Patent No.: US 11,477,880 B2
(45) Date of Patent: Oct. 18, 2022

(54) MODULE BOARD AND MEMORY MODULE INCLUDING THE SAME

(71) Applicant: SAMSUNG ELECTRONICS CO., LTD., Suwon-si (KR)

(72) Inventors: Wonseop Lee, Daegu (KR); Hwanwook Park, Seoul (KR); Jeonghoon Baek, Hwaseongi-si (KR); Dohyung Kim, Seoul (KR); Seunghee Mun, Yongin-si (KR); Dongyoon Seo, Seoul (KR); Jinoh Ahn, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/337,850

(22) Filed: Jun. 3, 2021

(65) Prior Publication Data
US 2022/0159827 A1    May 19, 2022

(30) Foreign Application Priority Data
Nov. 16, 2020    (KR) .................... 10-2020-0152459

(51) Int. Cl.
H05K 1/02    (2006.01)
H01L 25/11    (2006.01)
(Continued)

(52) U.S. Cl.
CPC ....... *H05K 1/0246* (2013.01); *G06F 13/4086* (2013.01); *G11C 5/04* (2013.01);
(Continued)

(58) Field of Classification Search
CPC ................. H05K 1/0246; H05K 1/025; H05K 2201/10159; G06F 13/4086; G11C 5/04;
(Continued)

(56) References Cited

U.S. PATENT DOCUMENTS 7,155,627 B2    12/2006   Matsui
7,606,042 B2    10/2009   Goodwin
(Continued)

*Primary Examiner* — Tri M Hoang
(74) *Attorney, Agent, or Firm* — Sughrue Mion, PLLC

(57) ABSTRACT

A module board and a memory module are provided. The module board includes a first branch line for connecting a clock signal terminal disposed on at least one surface to a first branch point; a first signal line for connecting the first branch point to a first module clock signal terminal; a second signal line for connecting the first module clock signal terminal to the $k^{th}$ module clock signal terminal and a first termination resistance terminal; a third signal line for connecting the first branch point to a $(k+1)^{th}$ module clock signal terminal; and a fourth signal line for connecting the $(k+1)^{th}$ module clock signal terminal to a $2k^{th}$ module clock signal terminal and the second termination resistance terminal, wherein a length of the third signal line is greater than a sum of a length of the first signal line and a length of the second signal line.

20 Claims, 12 Drawing Sheets

(51) Int. Cl.
*H01L 25/065* (2006.01)
*G11C 5/04* (2006.01)
*G11C 5/06* (2006.01)
*G11C 8/18* (2006.01)
*G06F 13/40* (2006.01)

(52) U.S. Cl.
CPC ............... *G11C 5/063* (2013.01); *G11C 8/18* (2013.01); *H01L 25/0657* (2013.01); *H01L 25/112* (2013.01); *H05K 1/025* (2013.01); *H05K 2201/10159* (2013.01)

(58) Field of Classification Search
CPC ....... G11C 5/063; G11C 8/18; H01L 25/0657; H01L 25/112
See application file for complete search history.

(56) References Cited

U.S. PATENT DOCUMENTS

| | | | |
|---|---|---|---|
| 7,746,095 B2 | 6/2010 | Pax et al. | |
| 7,869,243 B2 | 1/2011 | Bacha | |
| 8,036,011 B2 | 10/2011 | Kim et al. | |
| 9,082,464 B2* | 7/2015 | Sung | G11C 7/1057 |
| 9,449,650 B2* | 9/2016 | Seok | G11C 7/02 |
| 9,704,559 B2* | 7/2017 | Hayashi | G11C 7/10 |
| 9,786,354 B2* | 10/2017 | Seok | G11C 11/4093 |
| 9,793,034 B2* | 10/2017 | Seok | G11C 5/04 |
| 9,811,265 B2* | 11/2017 | Park | G11C 5/04 |
| 9,980,366 B2 | 5/2018 | Subramanian | |
| 10,199,363 B2* | 2/2019 | Tsukada | H01L 25/0655 |
| 10,622,029 B2* | 4/2020 | Kim | H05K 1/162 |
| 2004/0105292 A1 | 6/2004 | Matsui | |
| 2006/0184756 A1 | 8/2006 | Djordjevic et al. | |
| 2008/0030966 A1 | 2/2008 | Goodwin | |
| 2009/0027940 A1 | 1/2009 | Bacha | |
| 2009/0243649 A1 | 10/2009 | Pax et al. | |
| 2010/0125693 A1 | 5/2010 | Kim et al. | |
| 2012/0250264 A1* | 10/2012 | Osanai | G11C 5/04 361/728 |
| 2014/0233335 A1* | 8/2014 | Nishio | G11C 29/44 365/201 |
| 2016/0205767 A1 | 7/2016 | Subramanian | |

* cited by examiner

MODULE BOARD AND MEMORY MODULE INCLUDING THE SAME

CROSS-REFERENCE TO THE RELATED APPLICATION

This application is based on and claims priority under 35 U.S.C. § 119 to Korean Patent Application No. 10-2020-0152459, filed on Nov. 16, 2020, in the Korean Intellectual Property Office, the disclosure of which is incorporated herein by reference in its entirety.

BACKGROUND

1. Field

One or more embodiments of the disclosure relate to a module board and a memory module including the same.

2. Description of the Related Art

Memory modules may include a plurality of semiconductor memory devices installed on a module board. The memory module may be classified into a server-oriented memory module and a PC-oriented (client-oriented) memory module according to whether the memory module further includes a buffer on a module board.

The server-oriented memory module includes a buffer, and thus various levels of signals applied from an external device (e.g., a central processing unit (CPU)), a graphic processing unit (GPU), or the like) may be converted (e.g., amplified) and the converted signals may be transmitted to a plurality of memory devices. Thus, in the server-oriented memory module, even if load of a plurality of semiconductor memory devices is large, the quality of a clock signal and/or a command/address may not be affected.

On the other hand, the PC-oriented memory module does not include a buffer on a module board, and thus signals applied from an external device may be transmitted to a plurality of semiconductor memory devices without converting various levels of signals. Thus, in the PC-oriented memory module, when the load of a plurality of semiconductor memory devices is large, the quality of a clock signal and/or a command/address may be degraded.

SUMMARY

One or more embodiments of the disclosure provide a module board and a memory module including the same in which, even if the load of a plurality of semiconductor memory devices is large, the quality of a clock signal and/or a command/address may not be affected.

The technical problems solved by the one or more embodiments are not limited to the above technical problems, and other technical problems which are not described herein will become apparent to those skilled in the art from the following description.

According to an embodiment, there is provided a module board including: a plurality of stacked layers including a first layer to an nth layer; a first module clock signal terminal to a kth module clock signal terminal arranged at a first predetermined interval in a component region of at least one surface from among an upper surface of the first layer and a lower surface of the nth layer; a (k+1)th module clock signal terminal to a 2kth module clock signal terminal arranged at a second predetermined interval in the component region; a first termination resistance terminal disposed adjacent to the kth module clock signal terminal; a second termination resistance terminal disposed adjacent to the 2kth module clock signal terminal; a plurality of terminals arranged in a terminal region of the at least one surface and including a clock signal terminal; a first branch line for connecting the clock signal terminal disposed on the at least one surface to a first branch point; a first signal line for connecting the first branch point to the first module clock signal terminal; a second signal line for sequentially connecting the first module clock signal terminal to the kth module clock signal terminal and the first termination resistance terminal; a third signal line for connecting the first branch point to the (k+1)th module clock signal terminal; and a fourth signal line for sequentially connecting the (k+1)th module clock signal terminal to the 2kth module clock signal terminal and the second termination resistance terminal, wherein a length of the third signal line is greater than a sum of a length of the first signal line and a length of the second signal line.

According to an embodiment, there is provided a memory module including a module board. The module board includes: a plurality of stacked layers including a first layer to an nth layer; a first module clock signal terminal to a kth module clock signal terminal arranged at a first predetermined interval in a component region of at least one surface from among an upper surface of the first layer and a lower surface of the nth layer; a (k+1)th module clock signal terminal to a 2kth module clock signal terminal arranged at a second predetermined interval in the component region; a first termination resistance terminal disposed adjacent to the kth module clock signal terminal; a first termination resistor connected to the first termination resistance terminal; a second termination resistance terminal disposed adjacent to the 2kth module clock signal terminal; a second termination resistor connected to the second termination resistance terminal; a plurality of terminals arranged in a terminal region of the at least one surface and including a clock signal terminal; a first branch line for connecting the clock signal terminal disposed on the at least one surface to a first branch point; a first signal line for connecting the first branch point to the first module clock signal terminal; a second signal line for sequentially connecting the first module clock signal terminal to the kth module clock signal terminal and the first termination resistance terminal; a third signal line for connecting the first branch point to the (k+1)th module clock signal terminal; a fourth signal line for sequentially connecting the (k+1)th module clock signal terminal to the 2kth module clock signal terminal and the second termination resistance terminal; a first semiconductor memory device to a kth semiconductor memory device respectively including a first memory clock signal terminal to a kth memory clock signal terminal installed at the first module clock signal terminal to the kth module clock signal terminal; and a (k+1)th semiconductor memory device to a 2kth semiconductor memory device respectively including a (k+1)th memory clock signal terminal to a 2kth memory clock signal terminal installed at the (k+1)th module clock signal terminal to the 2kth module clock signal terminal, wherein a length of the third signal line is greater than a sum of a length of the first signal line and a length of the second signal line.

According to an embodiment, there is provided a memory system including a control device. The control device includes: a processor configured to generate an internal command, an internal address, and internal data by executing a program; a clock signal generator configured to generate a clock signal; a command/address generator configured to receive the internal command and the internal address from the processor based on the clock signal from the clock signal generator, and generating a command/address; and a data output interface configured to receive the internal data and generating 2 k pieces of data. The memory system further includes a memory module including a module board. The module board includes: a plurality of stacked layers including a first layer to an nth layer; a first module terminal to a kth module terminal arranged at a first predetermined interval in a component region of at least one surface from among an upper surface of the first layer and a lower surface of the nth layer; a (k+1)th module terminal to a 2kth module terminal arranged at a second predetermined interval in the component region; a first termination resistance terminal disposed adjacent to the kth module terminal; a first termination resistor connected to the first termination resistance terminal, a second termination resistance terminal disposed adjacent to the 2kth module terminal; a second termination resistor connected to the second termination resistance terminal; a plurality of terminals arranged in a terminal region of the at least one surface; a first branch line for connecting at least one of the plurality of terminals to the first branch point; a first signal line for connecting the first branch point to the first module terminal; a second signal line for sequentially connecting the first module terminal to the kth module terminal and the first termination resistance terminal; a third signal line for connecting the first branch point to the (k+1)th module terminal; a fourth signal line for sequentially connecting the (k+1)th module terminal to the 2kth module terminal and the second termination resistance terminal; a first semiconductor memory device to a kth semiconductor memory device respectively including a first memory terminal to a kth memory terminal installed at the first module terminal to the kth module terminal; and a (k+1)th semiconductor memory device to a 2kth semiconductor memory device respectively including a (k+1)th memory terminal to a 2kth memory terminal installed at the (k+1)th module terminal to the 2kth module terminal, wherein a length of the third signal line is greater than a sum of a length of the first signal line and a length of the second signal line.

DETAILED DESCRIPTION

Figure 1A:
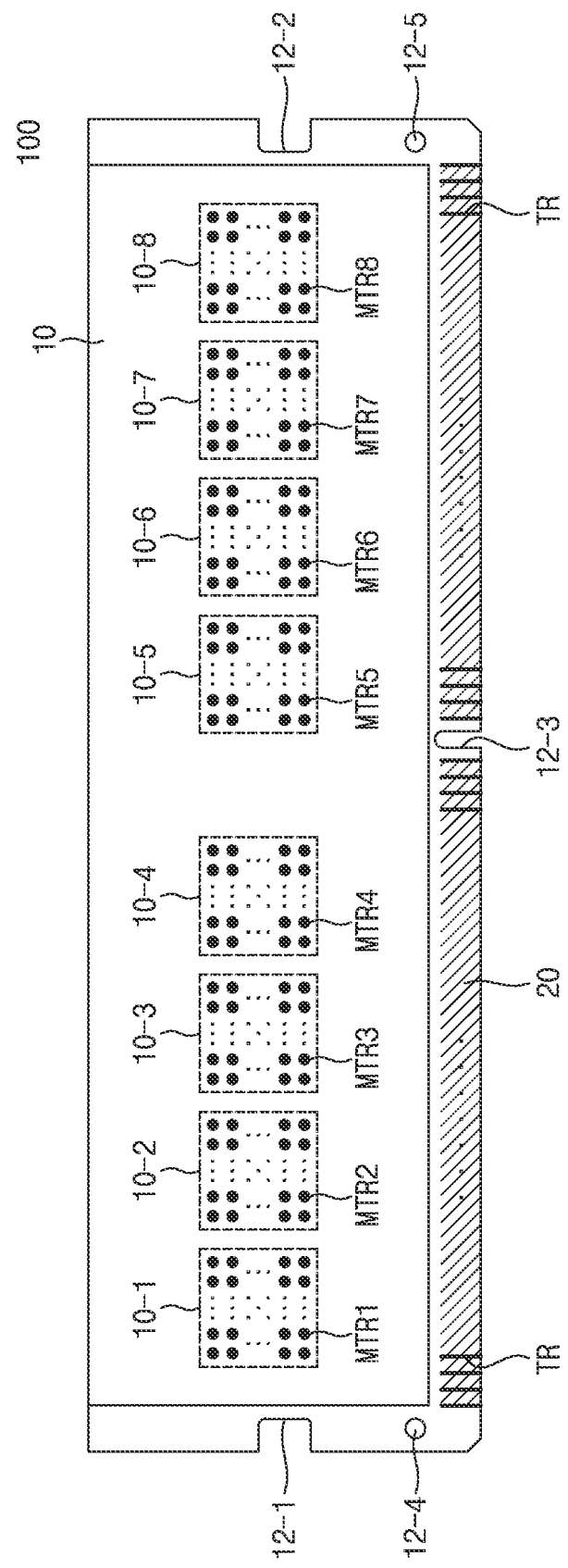
FIG. 1A is a diagram showing a module board according to an embodiment.

Hereinafter, a module board and a memory module including the same according to various embodiments of the disclosure will be described with reference to the accompanying drawings.

It will be understood that when an element, component, layer, pattern, structure, region, or so on (hereinafter collectively "element") of a semiconductor device is referred to as being "over," "above," "on," "below," "under," "beneath," "connected to" or "coupled to" another element the semiconductor device, it can be directly over, above, on, below, under, beneath, connected or coupled to the other element or an intervening element(s) may be present. In contrast, when an element of a semiconductor device is referred to as being "directly over," "directly above," "directly on," "directly below," "directly under," "directly beneath," "directly connected to" or "directly coupled to" another element of the semiconductor device, there are no intervening elements present. Like numerals refer to like elements throughout this disclosure.

Spatially relative terms, such as "over," "above," "on," "upper," "below," "under," "beneath," "lower," and the like, may be used herein for ease of description to describe one element's relationship to another element(s) as illustrated in the figures. It will be understood that the spatially relative terms are intended to encompass different orientations of a semiconductor device in use or operation in addition to the orientation depicted in the figures. For example, if the semiconductor device in the figures is turned over, elements described as "below" or "beneath" other elements would then be oriented "above" the other elements. Thus, the term "below" can encompass both an orientation of above and below. The semiconductor device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Herein, when a term "same" is used to compare a dimension of two or more elements, the term may cover a "substantially same" dimension.

It will be understood that, although the terms first, second, third, fourth etc. may be used herein to describe various elements, these elements should not be limited by these terms. These terms are only used to distinguish one element from another element. Thus, a first element discussed below could be termed a second element without departing from the teachings of the inventive concept.

One or more embodiments are described herein with reference to cross-sectional illustrations that are schematic illustrations of the embodiments (and intermediate structures). As such, variations from the shapes of the illustrations as a result, for example, of manufacturing techniques and/or tolerances, are to be expected. Thus, the one or more embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept. Further, in the drawings, the sizes and relative sizes of layers and regions may be exaggerated for clarity.

The term used in the one or more embodiments of the disclosure such as "unit" or "module" indicates a unit for processing at least one function or operation, and may be implemented in hardware, software, or in a combination of hardware and software.

The term "unit" or "module" may be implemented by a program that is stored in an addressable storage medium and executable by a processor.

For example, the term "unit" or "module" may include software components, object-oriented software components, class components and task components, processes, functions, attributes, procedures, subroutines, segments of a program code, drivers, firmware, microcode, circuitry, data, databases, data structures, tables, arrays, and/or variables.

For the sake of brevity, conventional elements to semiconductor devices may or may not be described in detail herein. However, even if a certain element is described or illustrated in a semiconductor device in this disclosure, the element may not be included in a claimed semiconductor device unless the element is recited as being included in the claimed semiconductor device.

FIG. 1A is a diagram showing a module board according to an embodiment. A module board 100 may include a component region 10 including a predetermined number of memory regions 10-1 to 10-4 (in which a predetermined number of (e.g., four) semiconductor memory devices are installed) which are arranged to from a left portion to a central portion of at least one (e.g., an upper surface) of an upper surface or a lower surface of the module board 100 and a predetermined number of memory regions 10-5 to 10-8 (in which a predetermined number of semiconductor memory devices are installed) which are arranged from the central portion to a right portion of at least one of an upper surface and a lower surface of the module board 100. A terminal (e.g., a tab) region 20 may be disposed in an edge region of one side (e.g., a lower side) of one surface of the module board 100, and a plurality of terminals TR may be arranged in a line (in the form of a stripe) in the terminal region 20. A plurality of module terminals MTR1, MTR2, . . . , and MTR8 may be arranged at corresponding positions in a plurality of memory terminals (e.g., balls) of semiconductor memory devices in the memory regions 10-1 to 10-8, respectively. However, the number of memory regions are not limited thereto, and may include any number of memory regions. The plurality of module terminals MTR1, MTR2, . . . , and MTR8 may be terminals to which data, a command/address, a clock signal, control signals, power, and so on are applied. The plurality of terminals TR may be terminals to which data, a command/address, a clock signal, control signals, and power are communicated. The module board 100 may include notches 12-1 to 12-3 and holes 12-4 and 12-5, which may serve as reference points for the positions of the module board 100.

Figure 1B:
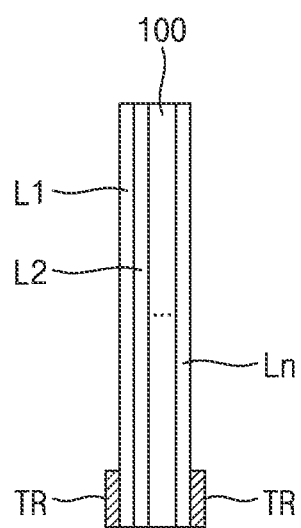
FIG. 1B is a cross-sectional view of the module board 100 according to an embodiment.

FIG. 1B is a cross-sectional view of the module board 100 according to an embodiment.

Referring to FIG. 1B, the module board 100 may be a printed circuit board configured by stacking a plurality of layers L1 to Ln, where n is an integer greater than or equal to 1. The plurality of terminals TR may be arranged on an upper surface of the first layer L1 and a lower surface of the $n^{th}$ layer Ln of the module board 100. The plurality of memory regions 10-1 to 10-8 may be disposed on at least one of the upper surface of the first layer L1 and the lower surface of the $n^{th}$ layer of the module board 100. Signal lines (e.g., lines for transmitting data, a command/address, a clock signal, and control signals) and/or power lines may be arranged on upper surfaces and/or lower surfaces of the layers L1 to Ln of the module board 100. The plurality of terminals TR may be connected to signals (e.g., data, a command/address, a clock signal, and control signals) and/or power applied from an external device (e.g., a central processing unit (CPU) or a graphic processing unit (GPU)). The plurality of terminals TR may transmit the signals and/or the power to corresponding signal lines and/or power lines that are arranged on at least one layer among the other layers L2 to Ln through corresponding vias of the first layer L1. The signals and/or power applied to the plurality of terminals TR may be transmitted to the plurality of module terminals MTR1, MTR2, . . . , and MTR8 through signal lines and vias arranged on at least two layers among the n layers L1 to Ln of the module board 100.

Figure 2:
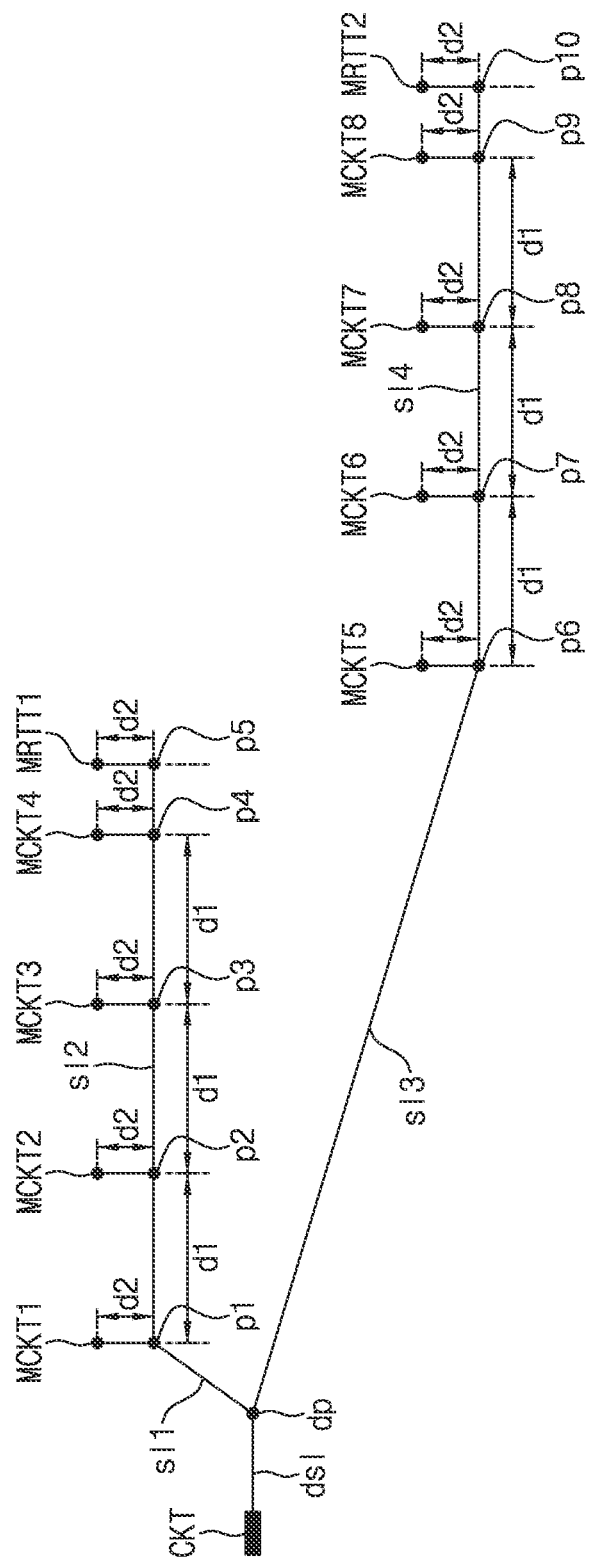
FIG. 2 is a schematic diagram showing arrangement of clock signal lines according to an embodiment.

FIG. 2 is a schematic diagram showing arrangement of clock signal lines according to an embodiment. CKT refers to a clock signal terminal among the plurality of terminals TR of the module board 100. MCKT1 to MCKT8 refer to module clock signal terminals of the eight module terminals MTR1 to MTR8 arranged in the memory regions 10-1 to 10-8. For example, the module clock signal terminals may be referred to as MCKTk, where k is an integer greater than or equal to 1. MRTT1 and MRTT2 refer to a first termination resistance terminal and a second termination resistance terminal, respectively, that are arranged in the component region 10.

Referring to FIG. 2, a clock signal terminal CKT may be connected to a branch point dp by a branch line dsl and may be connected to a first point p1 from the branch point dp by a first signal line sl1. The first point p1 may correspond to a point of the memory region 10-1 at which the module clock signal terminal MCKT1 is disposed.

The first point p1 may be connected to a fifth point p5 sequentially through a second point p2, a third point p3, and a fourth point p4 by a second signal line sl2. The second point p2, the third point p3, and the fourth point p4 may correspond to points of the memory regions 10-2, 10-3, and 10-4, respectively, at which the module clock signal terminals MCKT2, MCKT3, and MCKT4 are arranged. The fifth point p5 may be a point corresponding to the first termination resistance terminal MRTT1 to which a first termination resistor is connected. A first predetermined interval d1 may be provided between the first point p1 and the second point p2, between the second point p2 and the third point p3, and between the third point p3 and the fourth point p4. The length of the first signal line sl1 may be smaller than the first predetermined interval d1. In addition, a second predetermined interval d2 may be provided between the first point p1 and the first module clock signal terminal MCKT1, the second point p2 and the second module clock signal terminal MCKT2, the third point p3 and the third module clock signal terminal MCKT3, and the fourth point p4 and the fourth module clock signal terminal MCKT4, and the fifth point p5 and the first termination resistance terminal MRTT1. The length of the first signal line sl1 may be greater than the second predetermined interval d2. However, the predetermined intervals are not limited thereto, and the first predetermined interval and the second predetermined interval may vary between the points and/or between the points and the module clock signal terminals.

The branch point dp may be connected to a sixth point p6 by a third signal line sl3. The sixth point p6 may correspond to a point of the memory region 10-5 at which the module clock signal terminal MCKT5 is disposed. The length of the third signal line sl3 may be greater than the sum of the length of the first signal line sl1 and the length of the second signal line sl2. However, the lengths of the signal lines are not limited thereto, and the lengths of the signal lines may be variously configured.

The sixth point p6 may be connected to a tenth point p10 sequentially through a seventh point p7, an eighth point p8, and a ninth point p9 by a fourth signal line sl4. The length of the fourth signal line sl4 may be equal to the length of the second signal line sl2. The seventh point p7, the eighth point p8, and the ninth point p9 may correspond to points of the memory regions 10-6, 10-7, and 10-8, respectively, at which the module clock signal terminals MCKT6, MCKT7, and MCKT8 are arranged, and the tenth point p10 may be a point at which the second termination resistance terminal MRTT2 is disposed. The first predetermined interval d1 may be provided between the sixth point p6 and the seventh point p7, between the seventh point p7 and the eighth point p8, and between the eighth point p8 and the ninth point p9. In addition, the second predetermined interval d2 may be provided between the sixth point p6 and the fifth module clock signal terminal MCKT5, the seventh point p7 and the sixth module clock signal terminal MCKT6, the eighth point p8 and the seventh module clock signal terminal MCKT7, the ninth point p9 and the eighth module clock signal terminal MCKT8, and the tenth point p10 and the second termination resistance terminal MRTT2.

Figure 3:
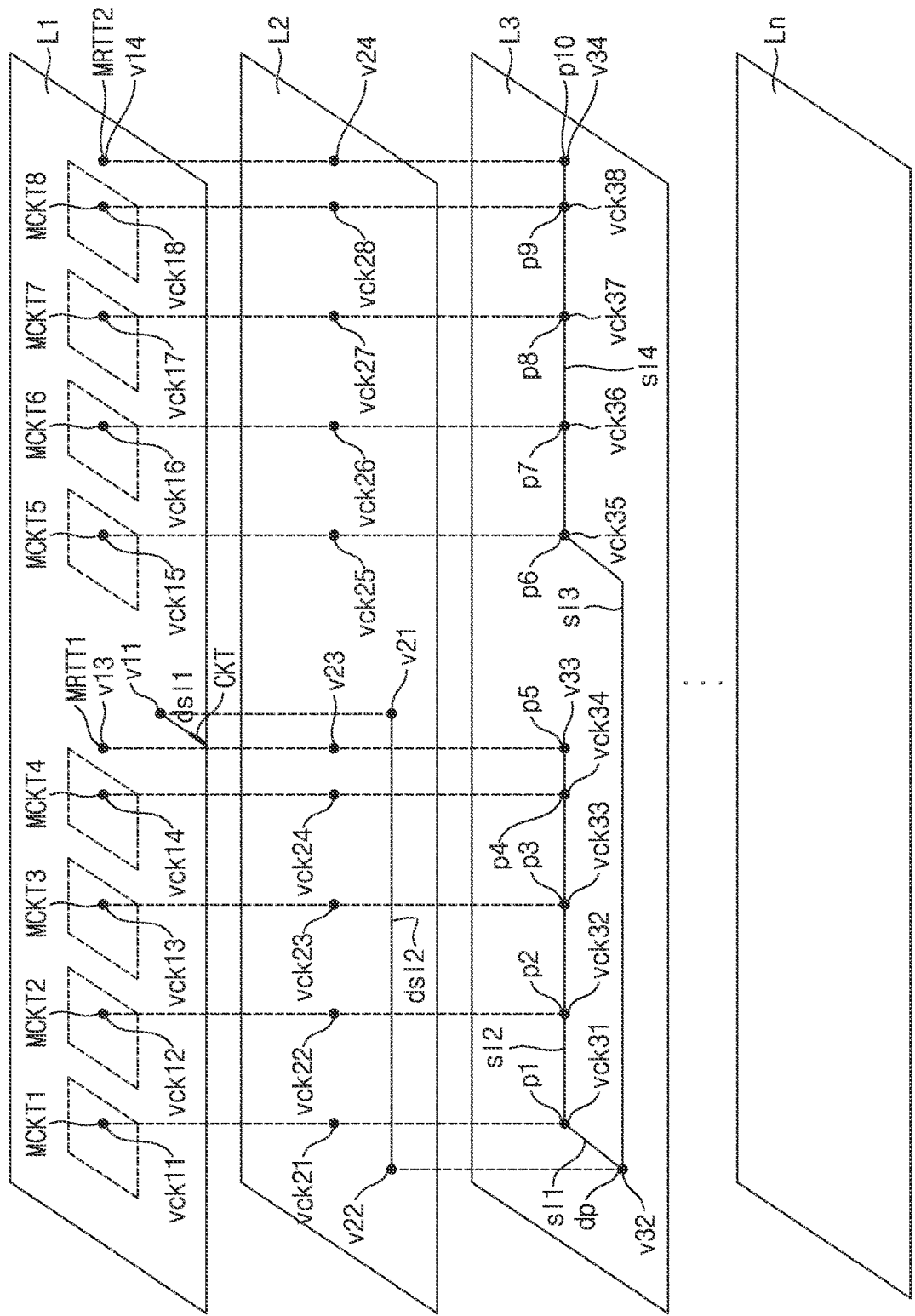
FIG. 3 is a diagram showing arrangement of clock signal lines according to an embodiment.

FIG. 3 is a diagram showing arrangement of clock signal lines according to an embodiment. FIG. 3 illustrates an example in which the arrangement of the clock signal lines shown in FIG. 2 is embodied on the module board 100 and illustrates an example of the case in which the clock signal terminal CKT is disposed at a central portion of the terminal region 20.

Referring to FIG. 3, the clock signal terminal CKT disposed on an upper surface of a first layer L1 of the module board 100 and a via v11 may be connected by a first sub branch line dsl1. The via v11 may be connected to a via v21 of a second layer L2, and the via v21 may be connected to a via v22 disposed adjacent to a clock signal via vck21 of the second layer L2 corresponding to the module clock signal terminal MCKT1 by a second sub branch line dsl2. The via v22 may be connected to a via v32 of a third layer L3. The first sub branch line dsl1 and the second sub branch line dsl2 may correspond to the branch line dsl of FIG. 2.

The via v32 of the third layer L3 may be connected to a clock signal via vck31 of the third layer L3 corresponding to the module clock signal terminal MCKT1 by the first signal line sl1, and the clock signal vias vck31, vck32, vck33, and vck34 of the third layer L3 corresponding to the module clock signal terminals MCKT1, MCKT2, MCKT3, and MCKT4 and the via v33 of the third layer L3 corresponding to the first termination resistance terminal MRTT1 may be connected to each other by the second signal line sl2. The via v32 of the third layer L3 may be connected to a clock signal via vck35 of the third layer L3 corresponding to the module clock signal terminal MCKT5 by the third signal line sl3, and clock signal vias vck35, vck36, vck37, and vck38 of the third layer L3 corresponding to the module clock signal terminals MCKT5, MCKT6, MCKT7, and MCKT8 and a via v34 of the third layer L3 corresponding to the second termination resistance terminal MRTT2 may be connected to each other by the fourth signal line sl4.

The module clock signal terminals MCKT1 to MCKT4, the first termination resistance terminal MRTT1, the module clock signal terminals MCKT5 to MCKT8, and the second termination resistance terminal MRTT2, which are arranged on the first layer L1, may be connected to clock signal vias vck21 to vck24, a via v23, clock signal vias vck25 to vck28, and a via v24, which are arranged on the second layer L2, through clock signal vias vck11 to vck14, a via v13, clock signal vias vck15 to vck18, and a via v14, which are arranged on the first layer L1, and may also be connected to clock signal vias vck31 to vck34, a via v33, clock signal vias vck35 to vck38, and a via v34, which are arranged on the third layer L3. In FIG. 3, the module clock signal terminals MCKT1 to MCKT4, the first termination resistance terminal MRTT1, the module clock signal terminals MCKT5 to MCKT8, and the second termination resistance terminal MRTT2, and the clock signal vias vck11 to vck14, the via v13, the clock signal vias vck15 to vck18, and the via v14, which are connected thereto, are integrally illustrated. In addition, connections between vertically connected vias are illustrated as dotted lines, and each of the dotted lines may correspond to the second predetermined interval d2 shown in FIG. 2.

Although FIG. 3 illustrates an example in which the first signal line sl1 to the fourth signal line sl4 are arranged on the third layer L3, the one or more embodiments are not limited thereto, and the first signal line sl1 to the fourth signal line sl4 may be arranged on the second layer L2. In addition, the first signal line sl1 and/or the fourth signal line sl4 may also be distributed and arranged on at least two layers, not on a single layer. The first signal line sl1 to the fourth signal line sl4 may be arranged on at least one of the n layers L1 to Ln.

The arrangement of the clock signal lines described above with reference to FIGS. 2 and 3 may have an asymmetric Y-topology structure. According to this structure, large signal attenuation occurs at the first point p1 and the sixth point p6 due to a difference between the length of the first signal line sl1 to the first point p1 from the branch point dp and the length of the third signal line sl3 to the sixth point p6 from the branch point dp. The signal attenuation may be reduced when the first predetermined interval d1 between the first to fourth points p1 to p4 and between the sixth to ninth points p6 to p9 is short. That is, the length of the second signal line sl2 to the fifth point p5 from the first point p1 at which signal attenuation begins to occur and the length of the fourth signal line sl4 to the tenth point p10 from the sixth point p6 at which signal attenuation begins to occur may be configured to be shorter.

For example, the command/address lines may also be arranged with the asymmetric Y-topology structure.

Figure 4:
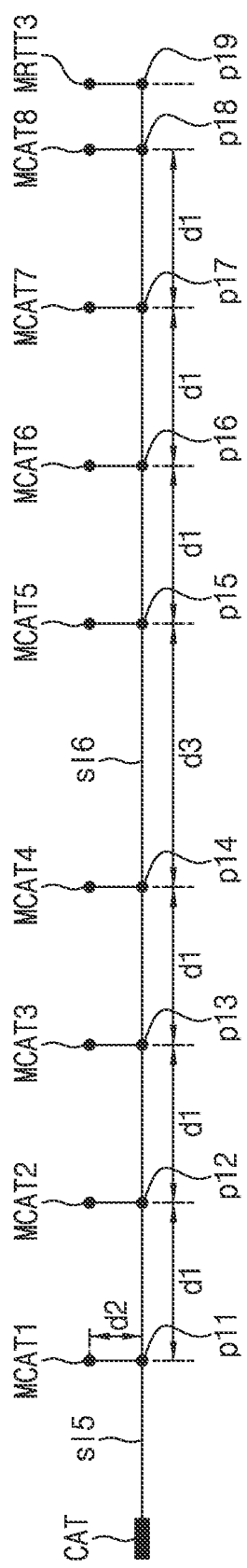
FIG. 4 is a conceptual diagram showing arrangement of command/address lines according to an embodiment.

FIG. 4 is a conceptual diagram showing arrangement of command/address lines according to an embodiment. A command/address terminal (CAT) may be a terminal among a plurality of terminals TR of the module board 100. MCAT1 to MCAT8 may refer to module command/address terminals among the eight module terminals MTR1 to MTR8 arranged in the memory regions 10-1 to 10-8.

Referring to FIG. 4, the command/address terminal CAT and an eleventh point p11 may be connected to each other by a fifth signal line sl5. The fifth signal line sl5 may have a length that is a sum of the length of the branch line dsl and the length of the first signal line sl1 shown in FIG. 2 in order to match timing between a clock signal applied through the clock signal terminal CKT and a command/address applied through the command/address terminal CAT. The eleventh point p11 may correspond to a point of the memory region 10-1 at which the module command/address terminal MCAT1 is disposed. The eleventh point p11 to a nineteenth point p19 may be connected by a sixth signal line sl6. A twelfth point p12 to an eighteenth point p18 may correspond to points of the memory regions 10-2 to 10-8 at which the module command/address terminals MCAT2 to MCAT8 are arranged, and the nineteenth point p19 may correspond to a point at which a third termination resistance terminal MRTT3 is disposed. A distance between a fourteenth point p14 and a fifteenth point p15 may be a third predetermined interval d3 that is greater than the first predetermined interval d1.

Figure 5:
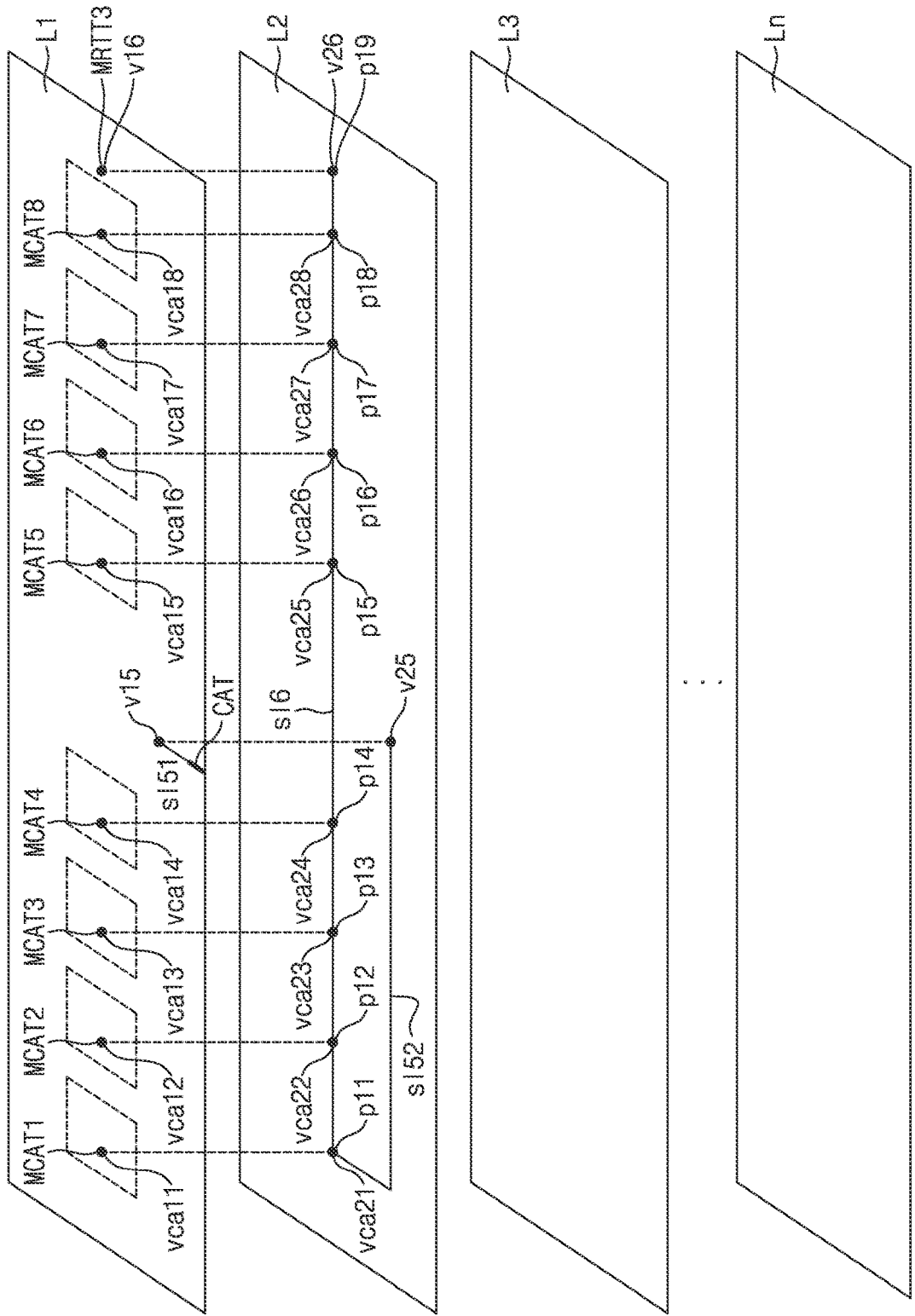
FIG. 5 is a diagram showing arrangement of command/address lines according to an embodiment.

FIG. 5 is a diagram showing arrangement of command/address lines according to an embodiment. FIG. 5 illustrates an example in which the arrangement of the command/address lines shown in FIG. 4 is embodied on the module board 100 and illustrates an example in which the command/address terminal CAT is disposed at a central portion of the terminal region 20.

Referring to FIG. 5, the command/address terminal CAT disposed on an upper surface of the first layer L1 of the module board 100 and a via v15 may be connected by a first sub signal line sl51. The via v15 may be connected to a via v25 of the second layer L2, and the via v25 may be connected to a command/address via vca21 of the second layer L2 corresponding to the module command/address terminal MCAT1 by a second sub signal line sl52. The first sub signal line sl51 and the second sub signal line sl52 may correspond to the fifth signal line sl5 shown in FIG. 4. The sum of the length of the first sub signal line sl51 and the length of the second sub signal line sl52 may be equal to the sum of the length of the first sub signal line sl51, the length of the second sub signal line sl52, and the length of the first signal line sl1 shown in FIG. 3.

The module command/address terminals MCAT1 to MCAT8, and the third termination resistance terminal MRTT3, which are arranged on the first layer L1, may be connected to command/address vias vca21 to vca28, and a via v26 arranged on the second layer L2 through command/address vias vca11 to vca18, and a via v16, which are arranged on the first layer L1. In FIG. 5, the module command/address terminals MCAT1 to MCAT8, and the third termination resistance terminal MRTT3, and the command/address vias vca11 to vca18, and the via v16, which are connected thereto, are integrally illustrated. Here, connections between vertically connected vias are illustrated as dotted lines, and each of the dotted lines may correspond to the second predetermined interval d2 shown in FIG. 4.

The arrangement of the command/address lines described above with reference to FIGS. 4 and 5 may have a fly-by topology structure.

Although FIG. 5 illustrates an example in which the fifth signal line sl5 and the sixth signal line sl6 are arranged on the second layer L2, the fifth signal line sl5 and the sixth signal line sl6 may be arranged on the other layers, for example, layers L3 to Ln. In addition, the fifth signal line sl5 and/or the sixth signal line sl6 may also be distributed and arranged on at least two different layers, not on a single layer. The fifth signal line sl5 and the sixth signal line sl6 may be arranged on at least one of the n layers L1 to Ln.

Figure 6:
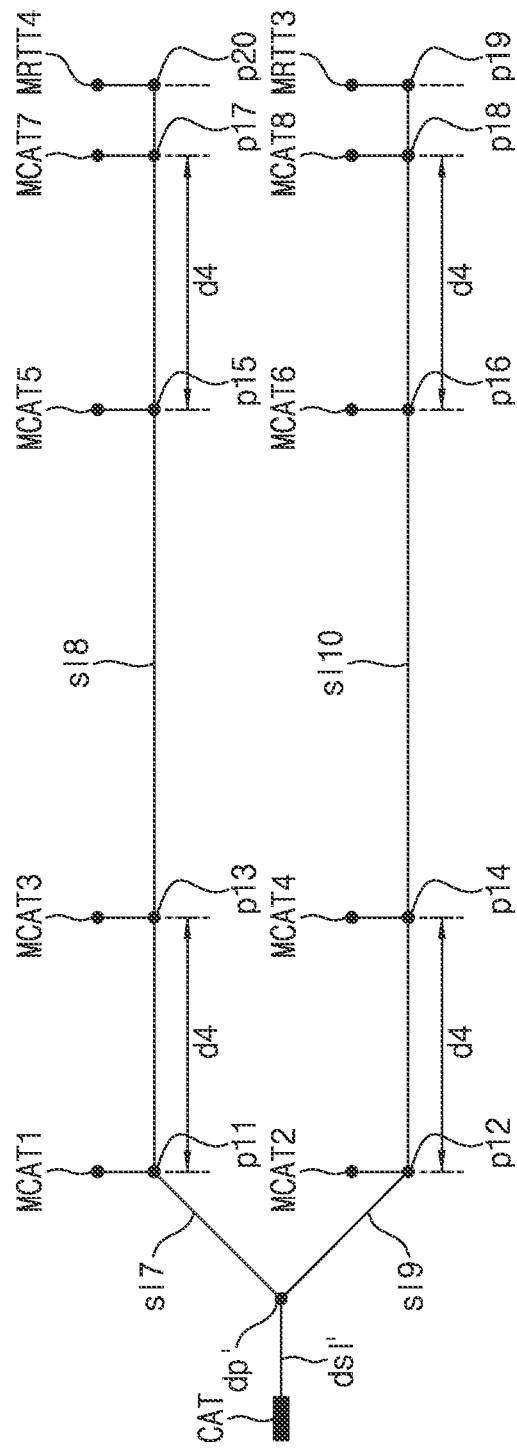
FIG. 6 is a conceptual diagram showing arrangement of command/address lines according to an embodiment.

FIG. 6 is a conceptual diagram showing arrangement of command/address lines according to an embodiment. CAT refers to one command/address terminal among a plurality of terminals TR of the module board 100 and MCAT1 to MCAT8 refer to the module command/address terminals among the eight module terminals MTR1 to MTR8 arranged in the memory regions 10-1 to 10-8.

Referring to FIG. 6, the command/address terminal CAT may be connected to a branch point dp' by a branch line dsl' and may be connected to the eleventh point p11 from the branch point dp' by a seventh signal line sl7. The eleventh point p11 may correspond to a point of the memory region 10-1 at which the module command/address terminal MCAT1 is disposed. The sum of the length of a branch line dsl' and the length of a seventh signal line sl7 may be equal to the sum of the length of the branch line dsl and the length of the first signal line sl1 shown in FIG. 2 in order to match timing between a clock signal applied through the clock signal terminal CKT and a command/address applied through the command/address terminal CAT. The eleventh point p11 may be connected to a twentieth point p20 sequentially through a thirteenth point p13, the fifteenth point p15, and a seventeenth point p17 by an eighth signal line sl8. The thirteenth point p13, the fifteenth point p15, and the seventeenth point p17 may correspond to points of the memory regions 10-3, 10-5, and 10-7, respectively, at which the module command/address terminals MCAT3, MCAT5, and MCAT7 are arranged, and the twentieth point p20 may correspond to points at which a fourth termination resistance terminal MRTT4 is disposed. A fourth predetermined interval d4 may be provided between the eleventh point p11 and the thirteenth point p13, and between the fifteenth point p15 and the seventeenth point p17. The fourth predetermined interval d4 may have a length that is twice the first predetermined interval d1 (e.g., d4=2×d1).

The branch point dp' may be connected to the twelfth point p12 by a ninth signal line sl9. The twelfth point p12 may correspond to a point of the memory region 10-2 at which the module command/address terminal MCAT2 is disposed. The length of the ninth signal line sl9 may be equal to the length of the seventh signal line sl7.

The twelfth point p12 may be connected to the nineteenth point p19 sequentially through the fourteenth point p14, a sixteenth point p16, and the eighteenth point p18 by a tenth signal line sl10. The fourteenth point p14, the sixteenth point p16, and the eighteenth point p18 may correspond to points of the memory regions 10-4, 10-6, and 10-8, respectively, at which the module command/address terminals MCAT4, MCAT6, and MCAT8 are arranged, and the nineteenth point p19 may correspond to a point at which the third termination resistance terminal MRTT3 is disposed. The fourth predetermined interval (e.g., d4=2×d1) may be provided between the twelfth point p12 and the fourteenth point p14, and between the sixteenth point p16 and the eighteenth point p18. The length of the tenth signal line sl10 may be equal to the length of the eighth signal line sl8.

Figure 7:
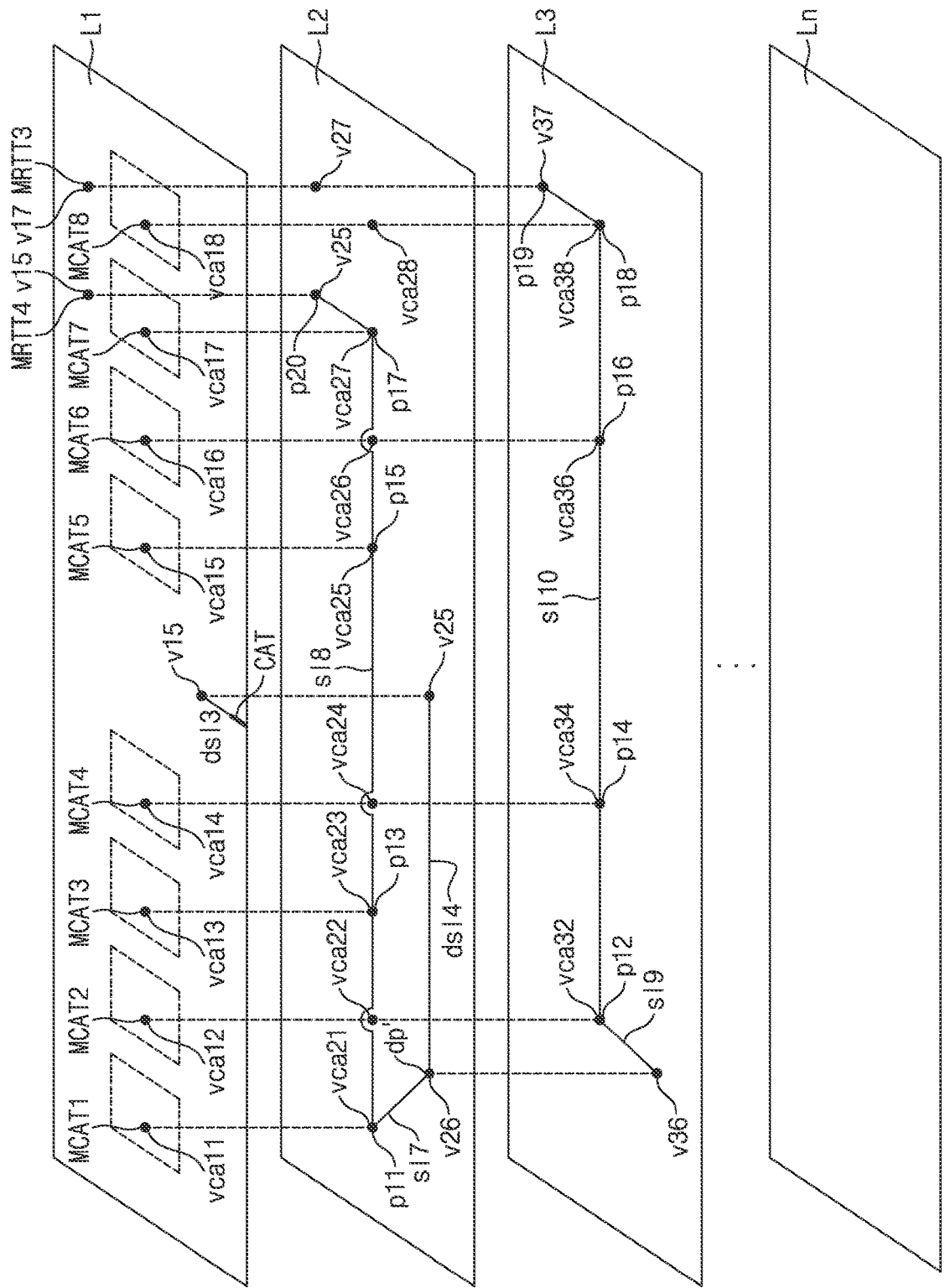
FIG. 7 is a diagram showing arrangement of command/address lines according to an embodiment.

FIG. 7 is a diagram showing arrangement of command/address lines according to an embodiment. FIG. 7 illustrates an example in which the arrangement of the command/address lines shown in FIG. 6 is embodied on the module board 100 and illustrates an example in which the command/address terminal CAT is disposed at a central portion of the terminal region 20.

Referring to FIG. 7, the command/address terminal CAT disposed on an upper surface of the first layer L1 of the module board 100 and the via v15 may be connected by a third sub branch line dsl3.

The via v15 may be connected to the via v25 of the second layer L2, and the via v25 may be connected to the via v26 of the second layer L2 by a fourth sub branch line dsl4. The third sub branch line dsl3 and the fourth sub branch line dsl4 may correspond to the branch line dsl' shown in FIG. 6. The via v26 may be connected to the command/address via vca21 disposed on the second layer L2 by the seventh signal line sl7. The command/address vias vca21, vca23, vca25, and vca27, and the via v25 may be connected to each other by the eighth signal line sl8. The command/address vias vca21, vca23, vca25, and vca27 may be arranged at positions corresponding to the positions of the first layer L1 at which the module command/address terminals MCAT1, MCAT3, MCAT5, and MCAT7 are arranged, respectively, and the via v25 may be disposed at a position corresponding to the position of the first layer L1 at which the fourth termination resistance terminal MRTT4 is disposed.

The via v26 may be connected to a via v36 of the third layer L3, and the via v36 may be connected to a command/address via vca32 disposed on the third layer L3 by the ninth signal line sl9. Command/address vias vca32, vca34, vca36, and vca38 and a via v37 may be connected to each other by the tenth signal line sl10. The command/address vias vca32, vca34, vca36, and vca38 may be arranged at positions of the first layer L1 at which the module command/address terminals MCAT2, MCAT4, MCAT6, and MCAT8 are arranged, respectively, and the via v37 may be arranged at a position corresponding to the position of the first layer L1 at which the third termination resistance terminal MRTT3 is disposed.

The module command/address terminals MCAT1 to MCAT8, and the third termination resistance terminal MRTT3, which are arranged on the first layer L1, may be connected to the command/address vias vca21 to vca28, and vias v25 and v27, which are arranged on the second layer L2, through the command/address vias vca11 to vca18, and vias v15 and v17, which are arranged on the first layer L1. In FIG. 7, the module command/address terminals MCAT1 to MCAT8, and the third termination resistance terminal MRTT3, the command/address vias vca11 to vca18, and the vias v15 and v17, which are connected thereto, are integrally illustrated. The connections between vertically connected vias are illustrated as dotted lines, and each of the dotted lines may correspond to the second predetermined interval d2 shown in FIG. 6.

The arrangement of the command/address lines described above with reference to FIGS. 6 and 7 may have a symmetric Y-topology structure.

Although FIG. 7 illustrates an example in which the seventh signal line sl7 and the eighth signal line sl8 are arranged on the second layer L2 and the ninth signal line sl9 and the tenth signal line sl10 are arranged on the third layer L3, the seventh signal line sl7 and the eighth signal line sl8, and the ninth signal line sl9 and the tenth signal line sl10 may be arranged on two different layers of the other layers L3 to Ln. In another embodiment, the seventh to tenth signal lines sl7 to sl10 may also be arranged on the second layer L2 or the third layer L3. That is, the seventh to tenth signal lines sl7 to sl10 may also be arranged on at least one of the second to $n^{th}$ layers L2 to Ln. The seventh signal line sl7 to the tenth signal line sl10 may also be distributed and arranged on at least three layers.

The arrangement of the command/address lines according to an embodiment may have one of an asymmetric Y-topology structure, a fly-by topology structure, and a symmetric Y-topology structure.

According to one or more embodiments, the clock signal line and the command/address line may be arranged on the same layer as long as they do not overlap with each other. However, when the clock signal line and the command/address line need to be arranged such that they need to overlap each other, the clock signal line and the command/address line may be provided on different layers.

Figure 8:
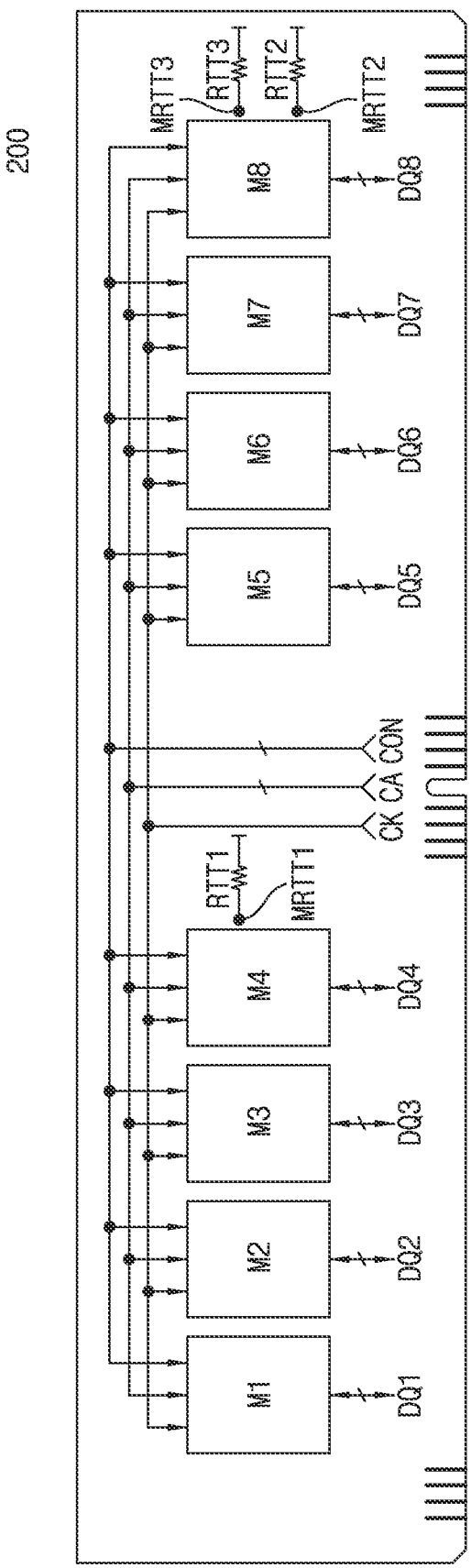
FIG. 8 is a diagram showing the configuration of a memory module according to an embodiment.
Figure 11:
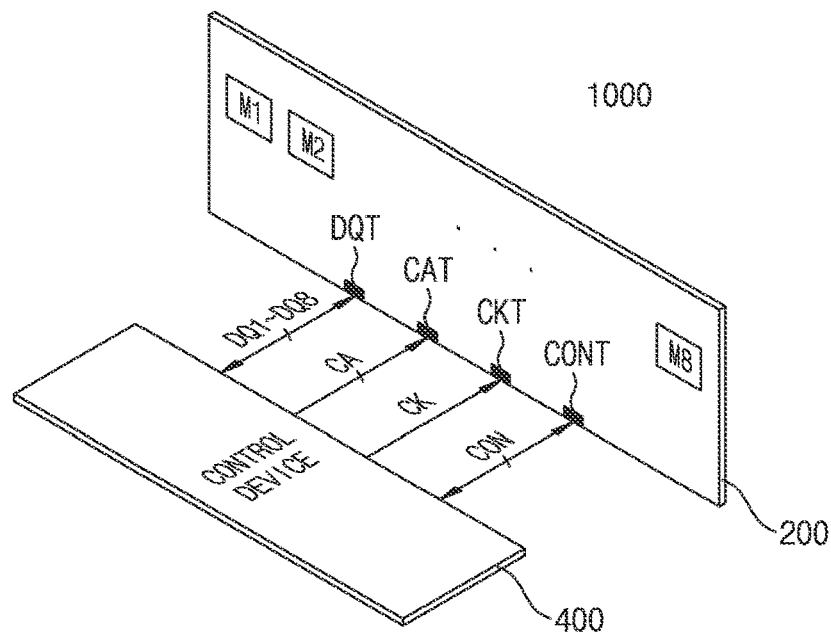
FIG. 11 is a diagram showing a memory system according to an embodiment.

FIG. 8 is a diagram showing the configuration of a memory module according to an embodiment. A memory module 200 may include the module board 100, a plurality of (e.g., 8) semiconductor memory devices M1 to M8, and first to third termination resistors RTT1 to RTT3. The terminals of the memory module 200 may include the clock signal terminal CKT, the command/address terminals CAT, and the plurality of (e.g., first to eighth) data terminals DQT1 to DQT8 (as shown in FIG. 11).

Referring to FIG. 8, the memory module 200 may commonly apply a clock signal CK through the clock signal terminal CKT to the semiconductor memory devices M1 to M8. The arrangement of the clock signal lines may have the aforementioned asymmetric Y-topology structure. The memory module 200 may commonly apply a command/address CA through the command/address terminals CAT to the semiconductor memory devices M1 to M8. Also, the arrangement of the command/address lines may have the fly-by topology structure described with reference to FIGS. 4 and 5. The memory module 200 may have control signal lines for commonly applying control signals CON through control signal terminals to the semiconductor memory devices M1 to M8, and the arrangement of the control signal lines may be the same as the arrangement of the command/address lines. Each of the plurality of semiconductor memory devices M1 to M8 may be a memory device having large load or capacity. Examples of the device may include a double data rate (DDR) (e.g., DDR3, DDR4, or DDR5) semiconductor memory device, a dual-die package (DDP) semiconductor memory device, or a high bandwidth memory (HBM) device. The memory module 200 may be an unbuffered dual in-line memory module, which does not include a buffer, or a small outline dual in-line memory module (SODEVIM).

The memory module 200 may transmit first data DQ1 to eighth data DQ8 applied through the first data terminal DQT1 to the eighth data terminal DQT8 to the semiconductor memory devices M1 to M8, respectively, or may transmit the first data DQ1 to the eighth data DQ8 output from the semiconductor memory devices M1 to M8 to the first data terminal DQT1 to eighth data terminal DQT8, respectively. Each of the first data DQ1 to the eighth data DQ8 may be predetermined-bit (e.g., 4, 8, or 16 bits) data.

When the arrangement of the command/address line has an asymmetric Y-topology structure or a symmetric Y-topology structure, the memory module 200 may include a third termination resistor and a fourth termination resistor.

Figure 9:
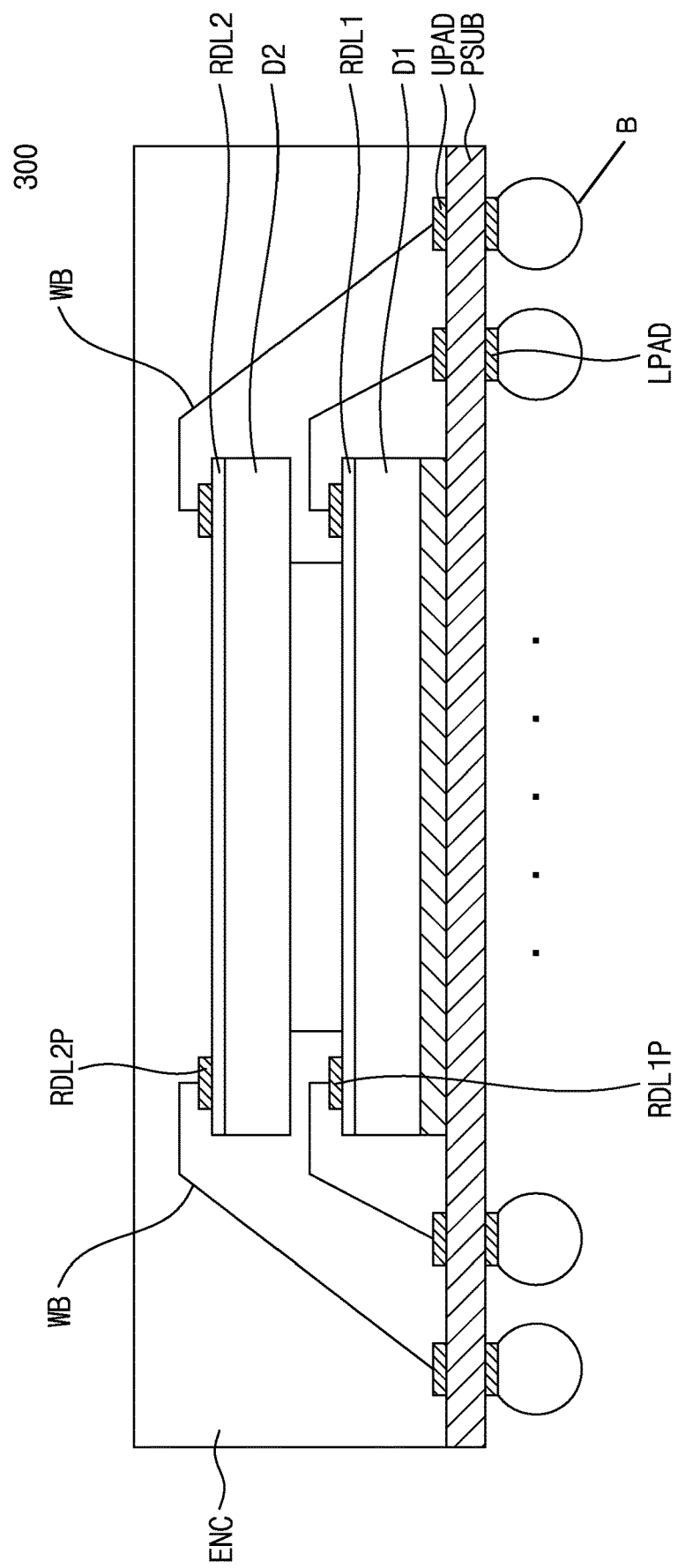
FIG. 9 is a diagram showing a semiconductor memory device according to an embodiment.

FIG. 9 is a diagram showing a semiconductor memory device according to an embodiment. A semiconductor memory device 300 may be a DDP semiconductor memory device.

Referring to FIG. 9, the DDP semiconductor memory device 300 may include a package substrate PSUB, a first die D1, and a second die D2. The first die D1 and the second die D2 may be sequentially stacked on the package substrate PSUB. The package substrate PSUB may include upper pads UPAD arranged on an upper surface of the package substrate PSUB, lower pads LPAD arranged on a lower surface of the package substrate PSUB, and signal lines for connecting pads corresponding to the upper pads UPAD and the lower pads LPAD. The DDP semiconductor memory device 300 may include memory terminals B (e.g., balls) attached to the lower pads LPAD.

A first redistribution layer RDL1 may be disposed on an upper surface of the first die D1, and a second redistribution layer RDL2 may be disposed on an upper surface of the second die D2. The first redistribution layer RDL1 may redistribute the positions of pads (not shown) of the first die D1. For example, the pads (not shown) of the first die D1, disposed at a central portion of the first die D1, may be connected to pads RDL1P of the first redistribution layer RDL1, disposed at an edge portion of the upper surface of the first redistribution layer RDL1, through the first redistribution layer RDL1. The second redistribution layer RDL2 may redistribute the positions of the pads (not shown) of the second die D2. For example, the pads (not shown) of the second die D2, disposed at a central portion of the second die D2, may be connected to pads RDL2P of the second redistribution layer RDL2, disposed at an edge portion of the upper surface of the second redistribution layer RDL2, through the second redistribution layer RDL2. The upper pads UPAD and corresponding pads among the pads RDL1P may be wire-bonded to each other by wires WB, and the upper pads UPAD and corresponding pads among the pads RDL2P may be wire-bonded to each other by wires WB. In addition, the DDP semiconductor memory device 300 may include an encapsulant ENC for encapsulating the package substrate PSUB, the first die D1, and the second die D2.

Figure 10:
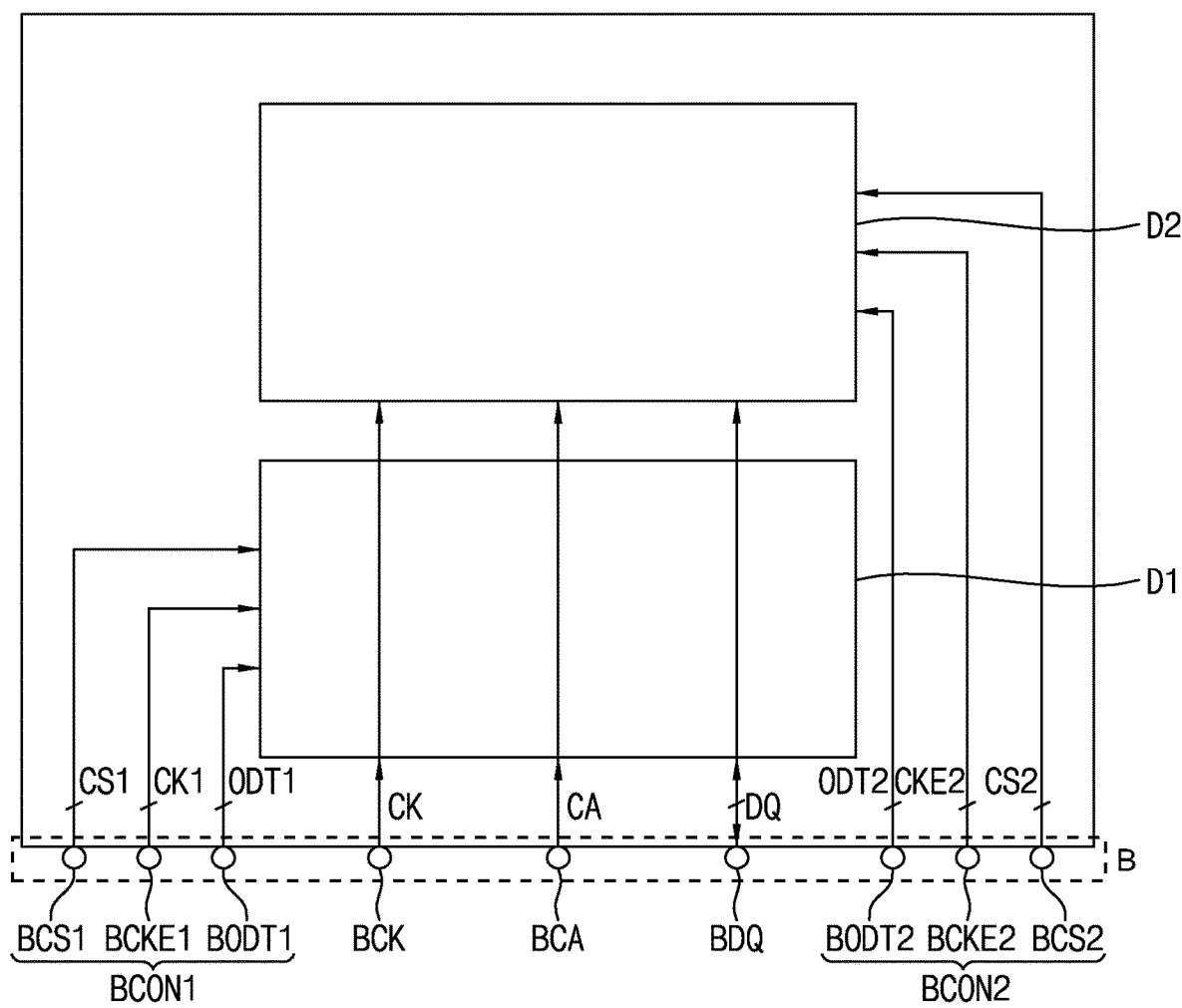
FIG. 10 is a diagram showing the configuration of a semiconductor memory device according to an embodiment.

FIG. 10 is a diagram showing the configuration of a semiconductor memory device according to an embodiment. FIG. 10 illustrates connection between memory terminals B, and the first die D1 and the second die D2 shown in FIG. 9.

Referring to FIG. 10, the memory terminals B may include first memory control signal terminal BCON1, a second memory control signal terminal BCON2, a memory clock signal terminal BCK, a memory command/address terminal BCA, and a memory data terminal BDQ. Here, one representative terminal for each signal is illustrated.

The first memory control signal terminals BCON1 including a first memory chip selection signal terminal BCS1, a first memory clock enable signal terminal BCKE1, and a first memory on-die termination signal terminal BODT1 may be connected to the first die D1. The second memory control signal terminals BCON2 including a second memory chip selection signal terminal BCS2, a second memory clock enable signal terminal BCKE2, and a second memory on-die termination signal terminal BODT2 may be connected to the second die D2. The memory clock signal terminal BCK, the memory command/address terminal BCA, and the memory data terminal BDQ may be commonly connected to the first die D1 and the second die D2.

With reference to FIG. 10, an operation of the first die D1 and the second die D2 will be described below.

The first die D1 may be selected in response to a first chip selection signal CS1, a first clock enable signal CKE1, and a first on-die termination signal ODT1 being applied to respective terminals of the first memory control signal terminals BCON1. When the first die D1 is selected, data DQ may be input or output in response to the clock signal CK and the command/address.

The second die D2 may be selected in response to a second chip selection signal CS2, a second clock enable signal CKE2, and a second on-die termination signal ODT2 being applied to respective terminals of the second memory control signal terminals BCON2. When the second die D2 is selected, the data DQ may be input or output in response to the clock signal CK and the command/address.

For example, each of the first die D1 and the second die D2 shown in FIG. 10 may be a DDR (e.g., DDR4) semiconductor memory device.

Although not shown, the arrangement of control signal lines may have one structure from among an asymmetric Y-topology structure, a fly-by topology structure, and a symmetric Y-topology structure, like the arrangement of the command/address lines.

FIG. 11 is a diagram showing a memory system according to an embodiment. A memory system 1000 may include at least one memory module 200 and a control unit 400.

In FIG. 11, the memory module 200 may be the module board 100 described above with reference to FIGS. 1A to 7 and the memory module described above with reference to FIGS. 8 to 10. In FIG. 11, data terminals of the terminals TR of FIG. 1A are denoted by DQT, command/address terminals are denoted by CAT, a clock signal terminal is denoted by CKT, and control signal terminals are denoted by CONT.

The control unit 400 may be, for example, a central processing unit (CPU) or a graphic processing unit (GPU). The control unit 400 may transmit a first plural-bits command/address, control signals CA, and a clock signal CK. The control unit 400 may transmit and receive eight pieces of second plural-bits data DQ1 to DQ8.

Figure 12:
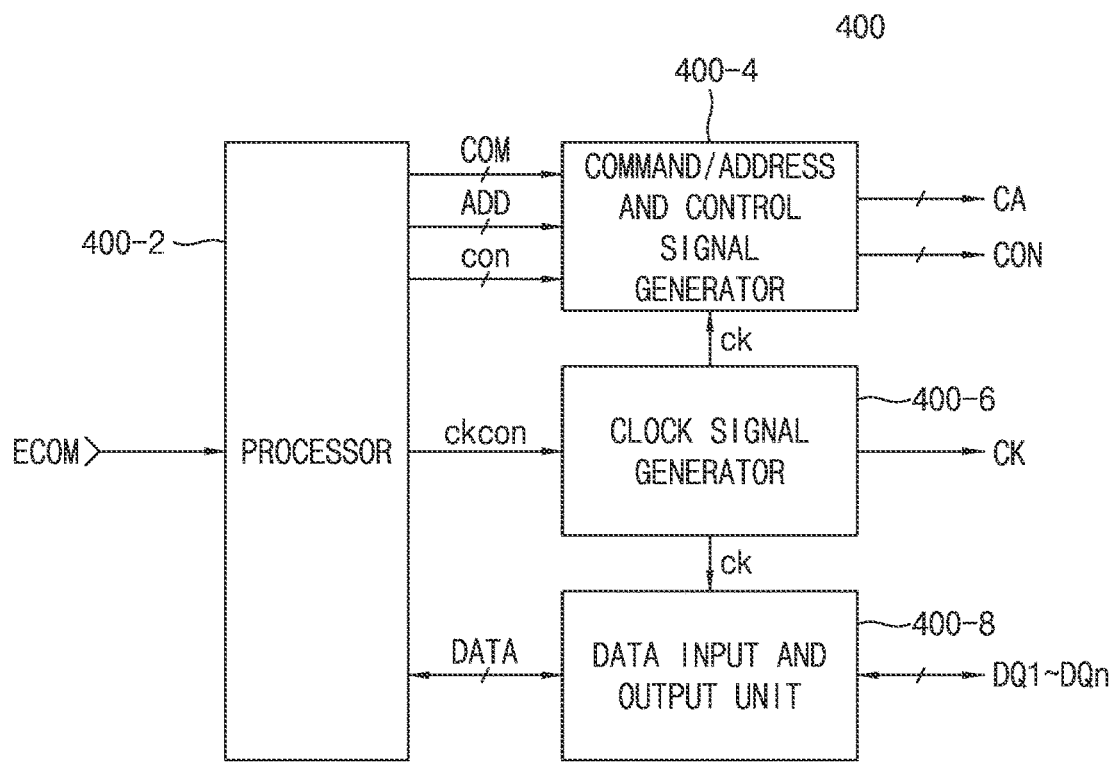
FIG. 12 is a block diagram showing the configuration of a control device according to an embodiment.

FIG. 12 is a block diagram showing the configuration of a control device according to an embodiment. The control device 400 may include a processor 400-2, a command/address and control signal generator 400-4, a clock signal generator 400-6, and a data input and output unit 400-8.

The function of each of blocks shown in FIG. 12 will be described below.

The processor 400-2 may generate a command COM, an address ADD, and a control signal con by executing a program according to an external command ECOM and may transmit and receive data DATA. For example, the processor 400-2 may receive the external command ECOM by communicating with various input devices, for example, a keyboard, a mouse, a touch sensor, a sound sensor, a fingerprint sensor, or a motion recognition sensor, and may generate the command COM, the address ADD, an internal control signal CONT, and data DATA by executing a program according to the external command ECOM. The processor 400-2 may receive and process the data DATA, and may output the data DATA to various output devices, for example, a display unit or a sound output unit. The processor 400-2 may additionally generate a clock signal control signal ckcon and transmit the clock signal control signal ckcon to a clock signal generator 400-6.

The command/address and control signal generator 400-4 may receive the command COM and the address ADD in response to an internal clock signal CK received from the clock signal generator 400-6, to generate the command/address CA of a first predetermined bit. The command/address and control signal generator 400-4 may also generate the control signal CON in response to the internal control signal con.

The clock signal generator 400-6 may generate the internal clock signal CK and the clock signal CK in response to the clock signal control signal ckcon received from the processor 400-2.

The data input and output unit 400-8 may receive the data DATA in response to the internal clock signal CK to generate eight pieces of the data DQ1 to DQ8 of a second predetermined bit or may receive the eight pieces of the data DQ1 to DQ8 of a second predetermined bit to generate the data DATA. For example, the data input and output unit 400-8 may generate the eight pieces of the data DQ1 to DQ8 of a second predetermined bit in response to the internal clock signal CK according to a DDR protocol.

According to the one or more embodiments of the present disclosure, the clock signal lines and/or the command/address lines of the module board may be arranged in the form of an asymmetric Y-topology structure, and thus even if the number of the plurality of semiconductor memory devices installed on the module board is large, the quality of the clock signal and the command/address may not be affected. Thus, the reliability of the operation of the memory module and the memory system may be improved.

While the one or more embodiments of the disclosure have been described with reference to the accompanying drawings, it will be understood by those skilled in the art that various modifications may be made without departing from the scope of the inventive concept and without changing essential features thereof. Therefore, the above-described embodiments are only example embodiment, and should be considered in a descriptive sense only and not for the purposes of limitation.

What is claimed is:

1. A module board comprising:
   a plurality of stacked layers including a first layer to an $n^{th}$ layer, wherein n is an integer greater than or equal to 1;
   a first module clock signal terminal to a $k^{th}$ module clock signal terminal arranged at a first predetermined interval in a component region of at least one surface from among an upper surface of the first layer and a lower surface of the $n^{th}$ layer, wherein k is an integer greater than or equal to 1;
   a $(k+1)^{th}$ module clock signal terminal to a $2k^{th}$ module clock signal terminal arranged at a second predetermined interval in the component region;
   a first termination resistance terminal disposed adjacent to the $k^{th}$ module clock signal terminal;
   a second termination resistance terminal disposed adjacent to the $2k^{th}$ module clock signal terminal;
   a plurality of terminals arranged in a terminal region of the at least one surface and comprising a clock signal terminal;
   a first branch line for connecting the clock signal terminal disposed on the at least one surface to a first branch point;
   a first signal line for connecting the first branch point to the first module clock signal terminal;
   a second signal line for sequentially connecting the first module clock signal terminal to the $k^{th}$ module clock signal terminal and the first termination resistance terminal;
   a third signal line for connecting the first branch point to the $(k+1)^{th}$ module clock signal terminal; and
   a fourth signal line for sequentially connecting the $(k+1)^{th}$ module clock signal terminal to the $2k^{th}$ module clock signal terminal and the second termination resistance terminal,
   wherein a length of the third signal line is greater than a sum of a length of the first signal line and a length of the second signal line.

2. The module board of claim 1, wherein the first predetermined interval is equal to the second predetermined interval, the length of the second signal line is equal to the length of the fourth signal line, and the length of the second signal line is greater than the length of the first signal line.

3. The module board of claim 2, wherein the first signal line, the second signal line, the third signal line, and the fourth signal line are disposed on at least one surface of the first layer to the $n^{th}$ layer except for the at least one surface.

4. The module board of claim 2, wherein the module board further comprises:
   a first module command/address terminal to a $k^{th}$ module command/address terminal arranged at the first predetermined interval in the component region;
   a $(k+1)^{th}$ module command/address terminal to a $2k^{th}$ module command/address terminal arranged at the second predetermined interval in the component region; and
   a third termination resistance terminal disposed adjacent to the $2k^{th}$ module command/address terminal,
   wherein the plurality of terminals further comprise a command/address terminal.

5. The module board of claim 4, wherein the module board further comprises:
   a second branch line for connecting the command/address terminal disposed on the at least one surface to a second branch point;
   a fifth signal line for connecting the second branch point to the first module command/address terminal; and
   a sixth signal line for sequentially connecting the first module command/address terminal to the $2k^{th}$ module command/address terminal and the third termination resistance terminal,
   wherein a sum of a length of the second branch line and a length of the fifth signal line is equal to a sum of a length of the first branch line and the length of the first signal line.

6. The module board of claim 5, wherein the fifth signal line and the sixth signal line are disposed on at least one surface of the first layer to the $n^{th}$ layer except for the at least one surface.

7. The module board of claim 4, wherein the module board further comprises:
   a fourth termination resistance terminal disposed adjacent to the $k^{th}$ module command/address terminal;
   a second branch line for connecting the command/address terminal disposed on the at least one surface to a second branch point;
   a fifth signal line for connecting the second branch point to the first module command/address terminal;
   a sixth signal line for sequentially connecting the first module command/address terminal to the $k^{th}$ module command/address terminal and the third termination resistance terminal;
   a seventh signal line for connecting the second branch point to the $(k+1)^{th}$ module command/address terminal; and
   an eighth signal line for sequentially connecting the $(k+1)^{th}$ module command/address terminal to the $2k^{th}$ module command/address terminal and the fourth termination resistance terminal,
   wherein a length of the seventh signal line is greater than a sum of a length of the fifth signal line and a length of the sixth signal line.

8. The module board of claim 7, wherein the length of the sixth signal line is equal to the length of the eighth signal line,
   the length of the sixth signal line is greater than the length of the fifth signal line,
   a sum of the length of a fifth branch line and the length of the sixth signal line is equal to a sum of the length of the first branch line and the length of the second signal line, and
   a sum of the length of the seventh signal line and the length of the eighth signal line is equal to a sum of the length of the third signal line and the length of the fourth signal line.

9. The module board of claim 8, wherein the fifth signal line, the sixth signal line, the seventh signal line, and the eighth signal line are disposed on at least one surface of the first layer to the $n^{th}$ layer except for the at least one surface.

10. The module board of claim 4, wherein the module board comprises:
a fourth termination resistance terminal disposed adjacent to a $(2k-1)^{th}$ module command/address terminal;
a second branch line for connecting the command/address terminal disposed on the at least one surface to a second branch point;
a fifth signal line for connecting the second branch point to the first module command/address terminal;
a sixth signal line for sequentially connecting odd-numbered module command/address terminals comprising the first module command/address terminal to the $(2k-1)^{th}$ module command/address terminal and the fourth termination resistance terminal;
a seventh signal line for connecting the second branch point to a second module command/address terminal among the first module command/address terminal to the $(2k-1)^{th}$ module command/address terminal; and
an eighth signal line for sequentially connecting even-numbered module command/address terminals comprising the second module command/address terminal to the $2k^{th}$ module command/address terminal and the third termination resistance terminal,
wherein a length of the fifth signal line is equal to a length of the seventh signal line, and a sum of a length of the second branch line and a length of fifth signal line is equal to a sum of a length of the first branch line and the length of the first signal line.

11. The module board of claim 10, wherein the fifth signal line, the sixth signal line, the seventh signal line, and the eighth signal line are disposed on at least one surface of the first layer to the $n^{th}$ layer except for the at least one surface.

12. A memory module comprising:
a module board comprising:
a plurality of stacked layers including a first layer to an $n^{th}$ layer, wherein n is an integer greater than or equal to 1;
a first module clock signal terminal to a $k^{th}$ module clock signal terminal arranged at a first predetermined interval in a component region of at least one surface from among an upper surface of the first layer and a lower surface of the $n^{th}$ layer, wherein k is an integer greater than or equal to 1;
a $(k+1)^{th}$ module clock signal terminal to a $2k^{th}$ module clock signal terminal arranged at a second predetermined interval in the component region;
a first termination resistance terminal disposed adjacent to the $k^{th}$ module clock signal terminal;
a first termination resistor connected to the first termination resistance terminal;
a second termination resistance terminal disposed adjacent to the $2k^{th}$ module clock signal terminal;
a second termination resistor connected to the second termination resistance terminal;
a plurality of terminals arranged in a terminal region of the at least one surface and comprising a clock signal terminal;
a first branch line for connecting the clock signal terminal disposed on the at least one surface to a first branch point;
a first signal line for connecting the first branch point to the first module clock signal terminal;
a second signal line for sequentially connecting the first module clock signal terminal to the $k^{th}$ module clock signal terminal and the first termination resistance terminal;
a third signal line for connecting the first branch point to the $(k+1)^{th}$ module clock signal terminal;
a fourth signal line for sequentially connecting the $(k+1)^{th}$ module clock signal terminal to the $2k^{th}$ module clock signal terminal and the second termination resistance terminal;
a first semiconductor memory device to a $k^{th}$ semiconductor memory device respectively comprising a first memory clock signal terminal to a $k^{th}$ memory clock signal terminal installed at the first module clock signal terminal to the $k^{th}$ module clock signal terminal; and
a $(k+1)^{th}$ semiconductor memory device to a $2k^{th}$ semiconductor memory device respectively comprising a $(k+1)^{th}$ memory clock signal terminal to a $2k^{th}$ memory clock signal terminal installed at the $(k+1)^{th}$ module clock signal terminal to the $2k^{th}$ module clock signal terminal,
wherein a length of the third signal line is greater than a sum of a length of the first signal line and a length of the second signal line.

13. The memory module of claim 12, wherein the first predetermined interval is equal to the second predetermined interval, the length of the second signal line is equal to the length of the fourth signal line, and the length of the second signal line is greater than the length of the first signal line.

14. The memory module of claim 13, wherein:
each of the first semiconductor memory device to the $2k^{th}$ semiconductor memory device is a dual-die package (DDP) semiconductor memory device comprising a first die and a second die in a stack;
each of the first die and the second die is a double data rate (DDR) semiconductor memory device; and
the memory module is an unbuffered dual in-line memory module (UDIMM) or a small outline dual in-line memory module (SODIMM).

15. The memory module of claim 13, wherein the first signal line, the second signal line, the third signal line, and the fourth signal line are disposed on at least one surface of the first layer to the $n^{th}$ layer except for the at least one surface.

16. The memory module of claim 13, wherein the module board further comprises:
a first module command/address terminal to a $k^{th}$ module command/address terminal arranged at the first predetermined interval in the component region;
a $(k+1)^{th}$ module command/address terminal to a $2k^{th}$ module command/address terminal arranged at the second predetermined interval in the component region; and
a third termination resistance terminal disposed adjacent to the $2k^{th}$ module command/address terminal,
wherein:
the first semiconductor memory device to the $k^{th}$ semiconductor memory device further comprise respective the first memory clock signal terminal to the $k^{th}$ memory clock signal terminal installed at the first module command/address terminal to the $k^{th}$ module command/address terminal; and
the $(k+1)^{th}$ semiconductor memory device to the $2k^{th}$ semiconductor memory device further comprise respective $(k+1)^{th}$ memory clock signal terminal to $2k^{th}$ memory clock signal terminal installed at the $(k+1)^{th}$ module command/address terminal to the $2k^{th}$ module command/address terminal.

17. The memory module of claim 16, further comprising:
a second branch line for connecting a command/address terminal disposed on the at least one surface to a second branch point;

a fifth signal line for connecting the second branch point to the first module command/address terminal; and a sixth signal line for sequentially connecting the first module command/address terminal to the $2k^{th}$ module command/address terminal and the third termination resistance terminal, wherein a sum of a length of the second branch line and a length of the fifth signal line is equal to a sum of a length of the first branch line and the length of the first signal line.

18. The memory module of claim 17, wherein the fifth signal line and the sixth signal line are disposed on at least one surface of the first layer to the $n^{th}$ layer except for the at least one surface.

19. The memory module of claim 16, further comprising:
a fourth termination resistance terminal disposed adjacent to the $k^{th}$ module command/address terminal;
a second branch line for connecting a command/address terminal disposed on the at least one surface to a second branch point;
a fifth signal line for connecting the second branch point to the first module command/address terminal;
a sixth signal line for sequentially connecting the first module command/address terminal to the $k^{th}$ module command/address terminal and the fourth termination resistance terminal;
a seventh signal line for connecting the second branch point to the $(k+1)^{th}$ module command/address terminal; and
an eighth signal line for sequentially connecting the $(k+1)^{th}$ module command/address terminal to the $2k^{th}$ module command/address terminal to the third termination resistance terminal, wherein a length of the seventh signal line is greater than a sum of a length of the fifth signal line and a length of the sixth signal line.

20. The memory module of claim 19, wherein the length of the sixth signal line is equal to the length of the eighth signal line,
the length of the sixth signal line is greater than the length of the fifth signal line,
a sum of the length of a fifth branch line and the length of the sixth signal line is equal to a sum of the length of the first branch line and the length of the second signal line, and
a sum of the length of the seventh signal line and the length of the eighth signal line is equal to a sum of the length of the third signal line and the length of the fourth signal line.

\* \* \* \* \*